United States Patent
Anumula

[19]

[11] Patent Number: 5,864,509
[45] Date of Patent: Jan. 26, 1999

[54] METHOD AND APPARATUS FOR REDUCING CONTINUOUS WRITE CYCLE CURRENT IN MEMORY DEVICE

[75] Inventor: Sudhaker Reddy Anumula, Starkville, Miss.

[73] Assignee: Cypress Semiconductor Corp., San Jose, Calif.

[21] Appl. No.: 816,877

[22] Filed: Mar. 13, 1997

[51] Int. Cl.⁶ ..................................................... G11C 7/00
[52] U.S. Cl. ................ 365/194; 365/189.01; 365/189.08
[58] Field of Search ............................... 365/194, 189.01, 365/189.08, 189.05

[56] References Cited

U.S. PATENT DOCUMENTS

| | | | |
|---|---|---|---|
| 4,879,681 | 11/1989 | Miwa et al. | 365/189.01 |
| 4,962,487 | 10/1990 | Suzuki | 365/233.5 |
| 5,327,392 | 7/1994 | Ohtsuka et al. | 365/194 X |
| 5,357,479 | 10/1994 | Matsui | 365/194 X |
| 5,546,355 | 8/1996 | Raatz et al. | 365/194 X |
| 5,590,088 | 12/1996 | Sakurada | 365/194 X |

*Primary Examiner*—Huan Hoang
*Attorney, Agent, or Firm*—Blakely, Sokoloff, Taylor & Zafman LLP

[57] ABSTRACT

The present invention significantly lowers the continuous write cycle ICC, thus lowering the overall ICC specification, for multi-port (and single port) memory devices without significant changes in $ICC_{WR}$ and $ICC_{RR}$ currents. In one embodiment, a circuit for the generation of a Write Data select signal (i.e., $\overline{TTL\_SEL}$) according to the present invention employs a unique "write power-down" delay ($t_{WPD}$) which is a function of "$\overline{CE} + \overline{WE}$" (chip select and write enable) and incorporates the delay into the generation of the Write Data select signal, $\overline{TTL\_SEL}$. The delay $t_{WPD}$ is provided by a delay device and is preferential. That is, a delay is provided when the internal write data select signal, i.e., TTL_sel (which is a function of "$\overline{CE} + \overline{WE}$"), transitions from logic "1" to a logic "0", but no delay is produced when TTL_sel transitions from a logic "0" to a logic "1".

20 Claims, 6 Drawing Sheets

METHOD AND APPARATUS FOR REDUCING CONTINUOUS WRITE CYCLE CURRENT IN MEMORY DEVICE

RELATED APPLICATIONS

The present application is related to and hereby claims the benefit of the filing date of a related Provisional Application for United States Letters Patent entitled "METHOD AND APPARATUS FOR REDUCING CONTINUOUS WRITE CYCLE CURRENT IN A MEMORY DEVICE", by Sudhaker Reddy Anumula, filed Feb. 21, 1997, and assigned application Ser. No. 60/039,016.

1. Field of the Invention

The present invention relates to power savings during continuous write cycles in memory devices by eliminating unnecessary switching currents in data input circuitry of a data path in the memory device during a continuous write operation.

2. Background

Conventional memory devices often consume unnecessary switching currents in their data input circuitry during a continuous write operation. For example, during a continuous write cycle (e.g., where two write operations follow one another back-to-back), bit lines of a memory device must first be precharged prior to the first write operation. Then during the first write operation, at least one of the bit lines must be pulled low for the write cycle and precharged back to the original operating potential before being pulled low again during the next write cycle (note, it may be the other bit line which is pulled low during the second write cycle). These operations consume a significant amount of current due to large bitline capacitances. During continuous read cycles, small bitline excursions or voltage swings are detected by sense amplifiers and, hence, continuous read operations consume less current than continuous write operations. Thus, it would be desirable to have a means for reducing the amount of unnecessary switching current consumed in the data input circuitry of a memory device during a continuous write cycle to lower the overall ICC specification for the device.

SUMMARY OF INVENTION

The present invention significantly lowers the continuous write cycle ICC, thus lowering the overall ICC specification for multi-port (and single port) memory devices without significant changes in $ICC_{WR}$ and $ICC_{RR}$ currents.

One embodiment of a circuit for the generation of a Write Data select signal (i.e., $\overline{TTL\_SEL}$) according to the present invention employs a unique "write power-down" delay ($t_{WPD}$) which is a function of "$\overline{CE} + \overline{WE}$" (chip select and write enable) and incorporates the delay into the generation of the Write Data select signal, $\overline{TTL\_SEL}$. The delay $t_{WPD}$ is provided by a delay device and is preferential. That is, a delay is provided when an internal write data select signal, i.e., TTL_sel (which is a function of "$\overline{CE} + \overline{WE}$"), transitions from a logic "1" to a logic "0", but no delay is produced when TTL_sel transitions from a logic "0" to a logic "1".

The $t_{WPD}$ delay is designed to meet the following requirements:

$$t_{WPD} + t_{MISC} < t_{PD}$$

$$t_{WPD} > MAX(t_{CEH}, t_{WEH})$$

where $t_{PD}$ is the $\overline{CE}$ high to power-down parameter, $t_{MISC}$ is the miscellaneous delays in the $\overline{CE}$ or $\overline{WE}$ path (the maximum of the two) from the $\overline{CE}$ or $\overline{WE}$ pad inputs to the $\overline{TTL\_SEL}$ input of a voltage level converter, excluding the $t_{WPD}$ delay. The maximum $\overline{CE}$ and $\overline{WE}$ signal high times during a continuous write cycle are $t_{CEH}$ and $t_{WEH}$ respectively.

The present invention achieves several desirable results. For example, in a continuous write cycle, the maximum $T_{CEH}$ and $t_{WEH}$ pulses are filtered and the $\overline{TTL\_SEL}$ signal is powered-up (active low) for the entire continuous write cycle. This eliminates the "un-necessary" transitions and "un-necessary" switching currents produced by the conventional schemes employed in other memory devices.

Further, the $t_{WPD}$ delay scheme of the present invention does not impact read and write parameters and the design can meet the $t_{PD}$ requirements of those memory components which provide such a limitation while still filtering the $MAX(t_{CEH}, t_{WEH})$ pulse widths.

In addition, for an "m" port memory device, having an "n-bit" databus width, the continuous write cycle ICC savings using the present invention, are proportional to "$m*n*I_{extra}$", where $I_{extra}$ is the "extra" switching current in the data write input path of conventional schemes associated with the generation of the $\overline{TTL\_SEL}$ signal, where "m" and "n" are integers.

It should be noted that in a commercially available dual port memory device, the technique described herein saved approximately 75 mA of current for a worst-case scenario as compared to the conventional techniques described above, for a 15 nS continuous write cycle time.

BRIEF DESCRIPTION OF THE DRAWINGS

The features and advantages of the present invention are illustrated by way of example in the accompanying drawings which are in no way intended to limit the scope of the present invention to the particular embodiments shown.

DETAILED DESCRIPTION

Described herein is a method and apparatus for reducing continuous write cycle current (ICC) in a memory device. The technique used eliminates unnecessary switching currents in data input circuitry of a data path in a memory device during a continuous write operation. In general, ICC has been a limiting factor in conventional high speed memory devices. For example, during a continuous write cycle (e.g., where two write operations follow one another back-to-back), bit lines of a memory device must first be precharged prior to the first write operation. Then during the first write operation, at least one of the bit lines must be pulled low for the write cycle and precharged back to the original operating potential before being pulled low again during the next write cycle (note, it may be the other bit line which is pulled low during the second write cycle). These operations consume a significant amount of current as compared to read cycle currents. The present invention reduces the overall consumption of current during a continuous write cycle by eliminating unnecessary switching in the data input circuitry of the memory device.

Figure 1:
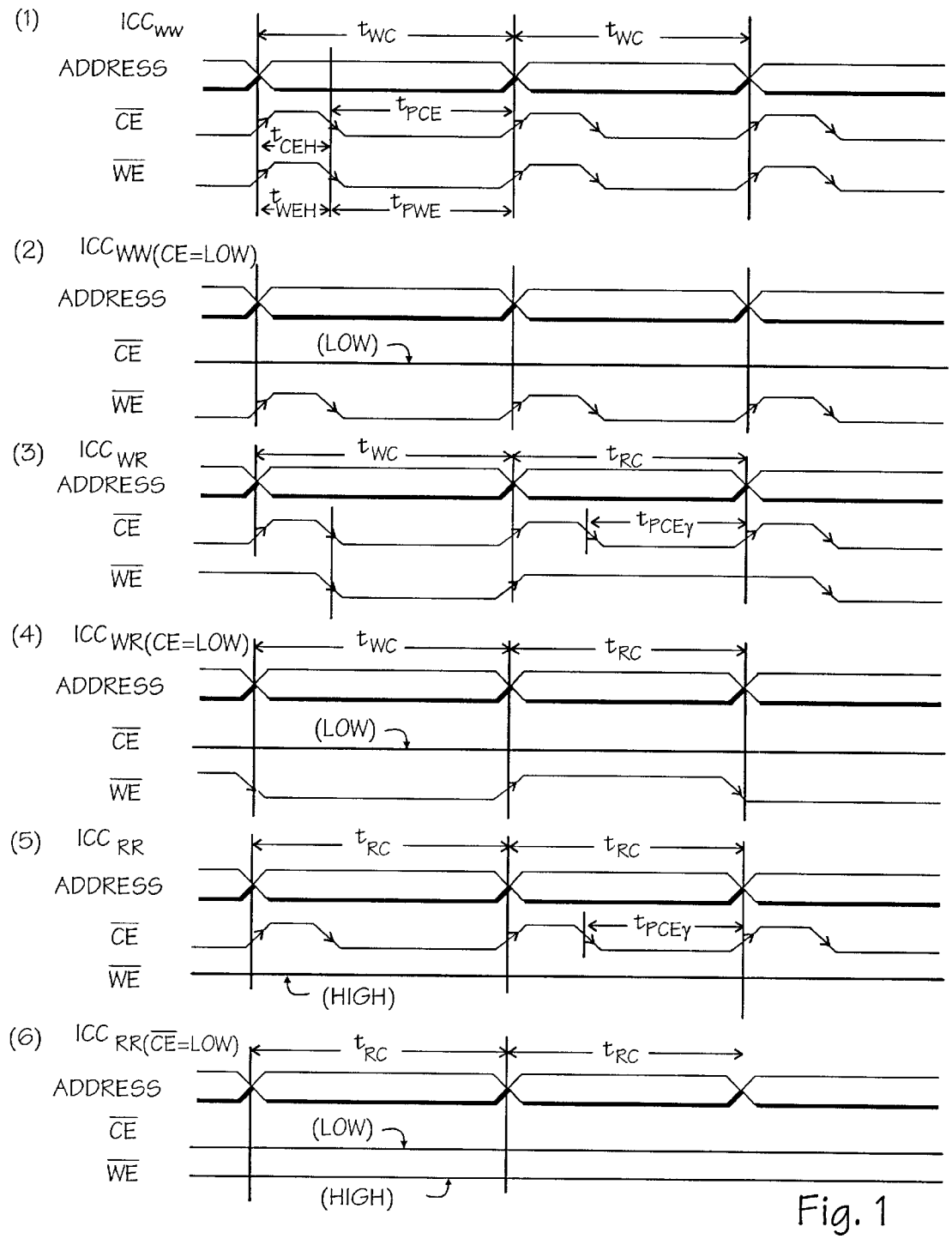
FIG. 1 illustrates various waveforms for dynamic ICC operations in a memory device.

As illustrated in FIG. 1, the dynamic ICC operations for memory parts may be classified as follows: (1) continuous write cycles ($ICC_{WW}$), (2) continuous write cycle with chip enable ($\overline{CE}$) low ($ICC_{WW(\overline{CE}=low)}$), (3) alternating write-read cycle ($ICC_{WR}$), (4) alternating write-read cycle with $\overline{CE}$ low ($ICC_{WR(\overline{CE}=low)}$), (5) continuous read cycle ($ICC_{RR}$), and (6) continuous read cycle with $\overline{CE}$ low ($ICC_{RR(\overline{CE}=low)}$). The address is toggling during each cycle while the data input may be low, high or toggling for the ICC operations.

Referring to FIG. 1, the following timing parameters are used for various ICC operations.

$t_{WC}$=Write Cycle time;

$t_{RC}$=Read Cycle time;

$t_{PWE}$=write enable ($\overline{WE}$) controlled write pulse width;

$t_{CEH}$=$\overline{CE}$ high time (maximum) during a Write/Read cycle;

$t_{WEH}$=$\overline{WE}$ high time (maximum) during a Write cycle;

$t_{PCE}$=$\overline{CE}$ controlled write pulse width; and $t_{PCER}$=$\overline{CE}$ controlled Read pulse width.

Generally for multi-port memory parts and specifically for high-speed parts, the continuous write cycle ICC is a major factor dictating the dynamic ICC of memory parts. For example, in dual port memory products, the relation described in equation (1) is generally observed for the dynamic ICC characteristics of the part (note that equation (1) also holds true for the $\overline{CE}$=low cases).

$$ICC_{RR} < ICC_{WR} < ICC_{WW} \quad (1)$$

Equation (1) indicates that it is the ICC for a continuous write cycle that presents the limiting factor. This is generally true because, as noted above, during a continuous write cycle, the bit lines of a memory device must be precharged, driven, precharged, then driven again. Each time, the voltage swing is approximately VCC (operating voltage potential) to VSS (reference voltage potential, usually ground). However, during a continuous read cycle, the bitlines are typically precharged then driven so that there is only a minor voltage swing (enough for a sense amplifier to detect). Thus, less current is required during such operations. Similarly, where a write cycle is followed by a read cycle (or a read cycle followed by a write cycle), less current is drawn than for the case of two back-to-back write cycles because the bitlines are not driven across a full VCC-VSS voltage swing during the read portion of the cycle. Hence, it is important to control any unnecessary switching currents in the input data path during a continuous write cycle.

The present invention significantly lowers the continuous write cycle ICC, thus lowering the overall ICC specification for multi-port (and single port) memory devices without significant changes in $ICC_{WR}$ and $ICC_{RR}$ currents.

Figure 2:
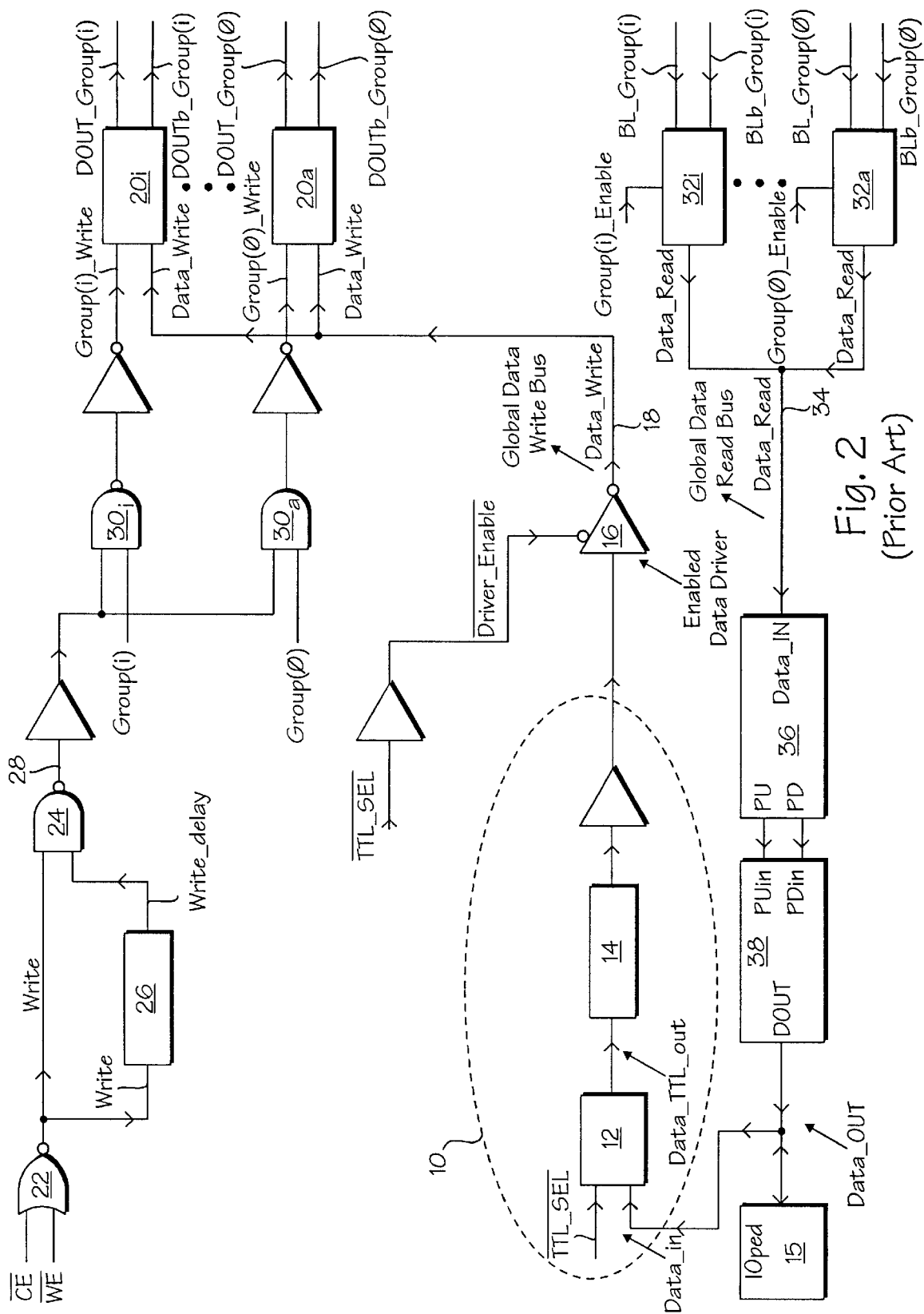
FIG. 2 illustrates conventional data path circuitry in a memory device.

A conventional random access memory (RAM) read/write architecture block diagram is illustrated in FIG. 2. In particular, FIG. 2 shows conventional data input/output (I/O) circuitry and its related interfaces to memory group bitlines and control signals. Input data signals (Data__IN) from an input/output pad 5 are applied to the memory device and received at circuitry 10. Circuitry 10 is a "data input path" for the memory device and receives TTL-compatible signals Data__IN from I/O pad 5. The Data__IN signals are presented to a voltage level converter circuit 12. Voltage level converter circuit 12 converts the TTL level signals to CMOS-compatible signals for use in the memory device. The voltage level converter circuit is activated in response to a "write data select signal", labeled $\overline{TTL\_SEL}$, which is described in further detail below.

In response to the write data select signal, voltage level converter circuit 12 generates a write data signal, Data__TTL__out, which is applied to an input of delay element 14. Delay element 14 provides any necessary delays for data signal setup and hold as required by the memory device. The delayed signals are then passed to a data driver 16 which generates a Data__Write signal on global data write bus 18 in response to an enable signal Driver__Enable. The Driver__Enable signal is produced from the write data select signal, $\overline{TTL\_SEL}$ as indicated.

Signal Data__Write is the data signal to be applied to the appropriate bitlines of the memory device to write data into selected individual memory cells. Accordingly, signal Data__Write is applied to data drivers 20a–20i. For those memory devices which are organized into a number of groups of memory cells, each group of cells will have a corresponding data driver 20. Thus, data driver 20a corresponds to group(0), etc., and in general, data driver 20i corresponds to cells of group(i).

The data drivers 20a–20i are activated in response to group write signals Group(0)__Write–Group(i)__Write. The group write signals are generated from the chip enable ($\overline{CE}$) and/or write enable ($\overline{WE}$) signals presented to the memory device. For example, using NOR gate 22 a signal Write is developed from the $\overline{CE}$ and $\overline{WE}$ signals. This signal Write is applied to the input of NAND gate 24 and to delay element 26. Delay element 26 provides any required delays for address set-up and produces signal Write__delay which is applied to NAND gate 24. When signals Write and Write__delay are both active, NAND gate 24 produces an output signal on line 28 (active low) which is applied to the inputs of NAND gates 30a–30i.

NAND gates 30a–30i also receive group select signals Group(0)–Group(i) and, in response, the NAND gate corresponding to the selected group of memory cells will provide a corresponding group write signal, Group(0)__Write–Group(i)__Write, to a corresponding data driver 20a–20i. The selected data driver 20a–20i will then provide data signals DOUT__Group and DOUTb__Group to the appropriate memory cell group via the appropriate bit lines. Note that the signals DOUT__Group and DOUTb__Group are logic compliments.

The read path circuitry for the memory device is also illustrated in FIG. 2. Bitline signals BL__Group and BLb__Group (again logic complements) are received by sense amplifiers 32a–32i. In response to corresponding Group__Enable signals, the sense amplifiers 32a–32i generate signals Data__Read which are provided to global data read bus 34. In some embodiments, global data read bus 34 and global data write bus 18 may be the same bus.

The Data__Read signals on global data read bus 34 are provided to output buffer 36 which generates and provides appropriate pull up and pull down signals to output driver 38. Output driver 38 then generates the output signal Data__OUT which is provided to I/O pad 5.

The "circled" portion of circuitry, reference numeral 10, in FIG. 2, is of particular interest to the present invention. Circuitry 10 represents the "data input path" of a memory device comprising TTL-to-CMOS voltage level converter circuit 12 and a Data Setup/Hold delay circuit 14. The present invention pertains to the generation of a "Write Data select signal", i.e., labeled $\overline{TTL\_SEL}$ in FIG. 2, that controls a chip-select input of the TTL-to-CMOS level converter circuit 12.

Figure 3:
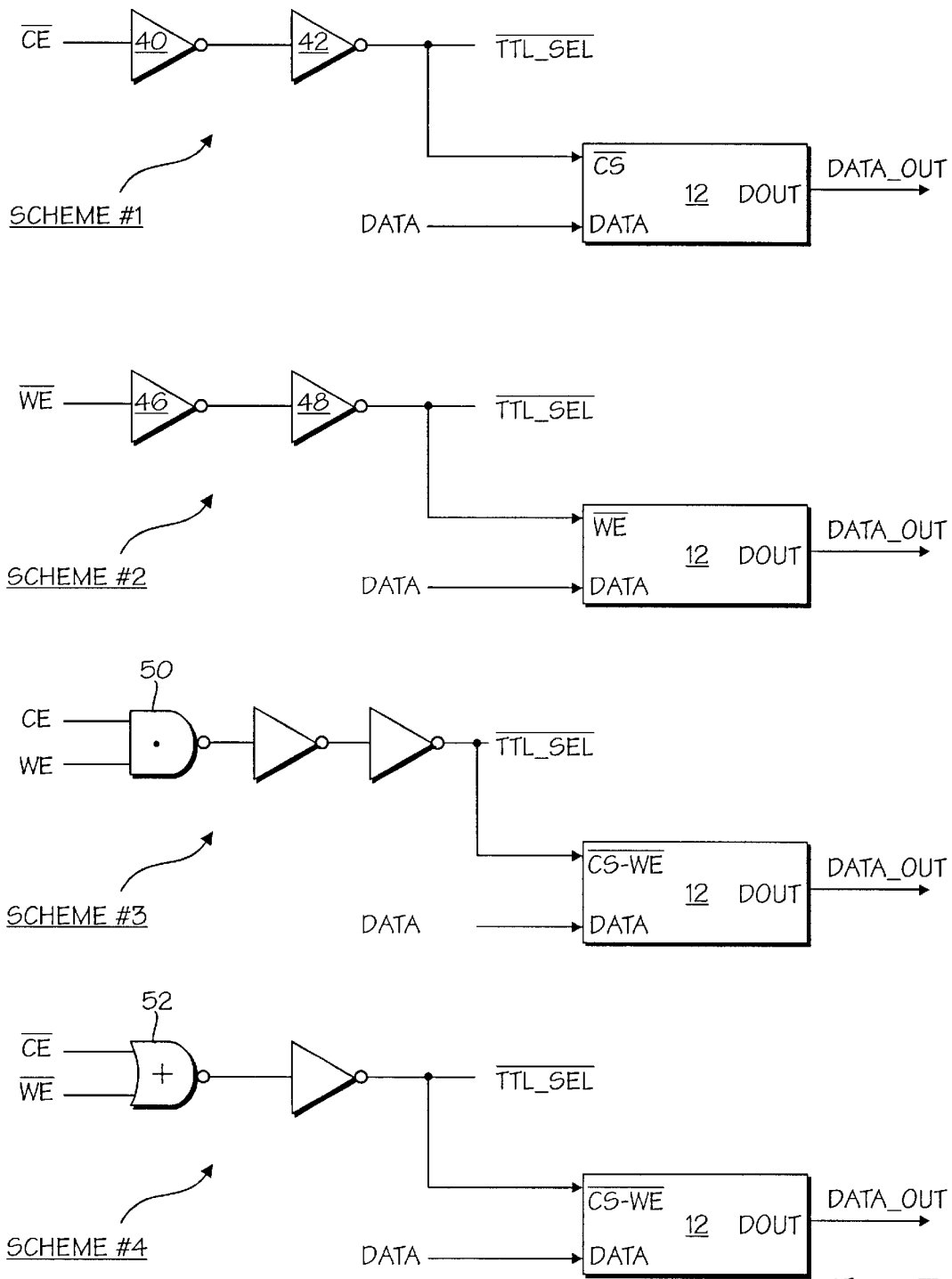
FIG. 3 illustrates various conventional schemes for generating a write select signal.

Some conventional schemes for generating the TTL_SEL signal are shown in FIG. 3. One method, scheme 1, generates a TTL_SEL signal as buffered version of a chip select signal $\overline{CE}$. Such a scheme generally employs a pair of series coupled inverters 40 and 42 to produce the TTL_SEL signal. Scheme 2 generates the TTL_SEL signal as buffered version of the write enable signal $\overline{WE}$. Again, a pair of series coupled inverters 46 and 48 are used. Schemes 3 and 4 generate the TTL_SEL signal as logic function of $\overline{CE}$ and $\overline{WE}$. For example, scheme 3 shows how a NAND gate 50 may be used to generate the TTL_SEL signal i.e., $\overline{CE}*\overline{WE}$. Scheme 4 shows an alternative method which makes use of a NOR gate 52 to produce an intermediate signal (i.e., $\overline{CE} + \overline{WE}$) which is then inverted to produce TTL_SEL.

Figure 4:
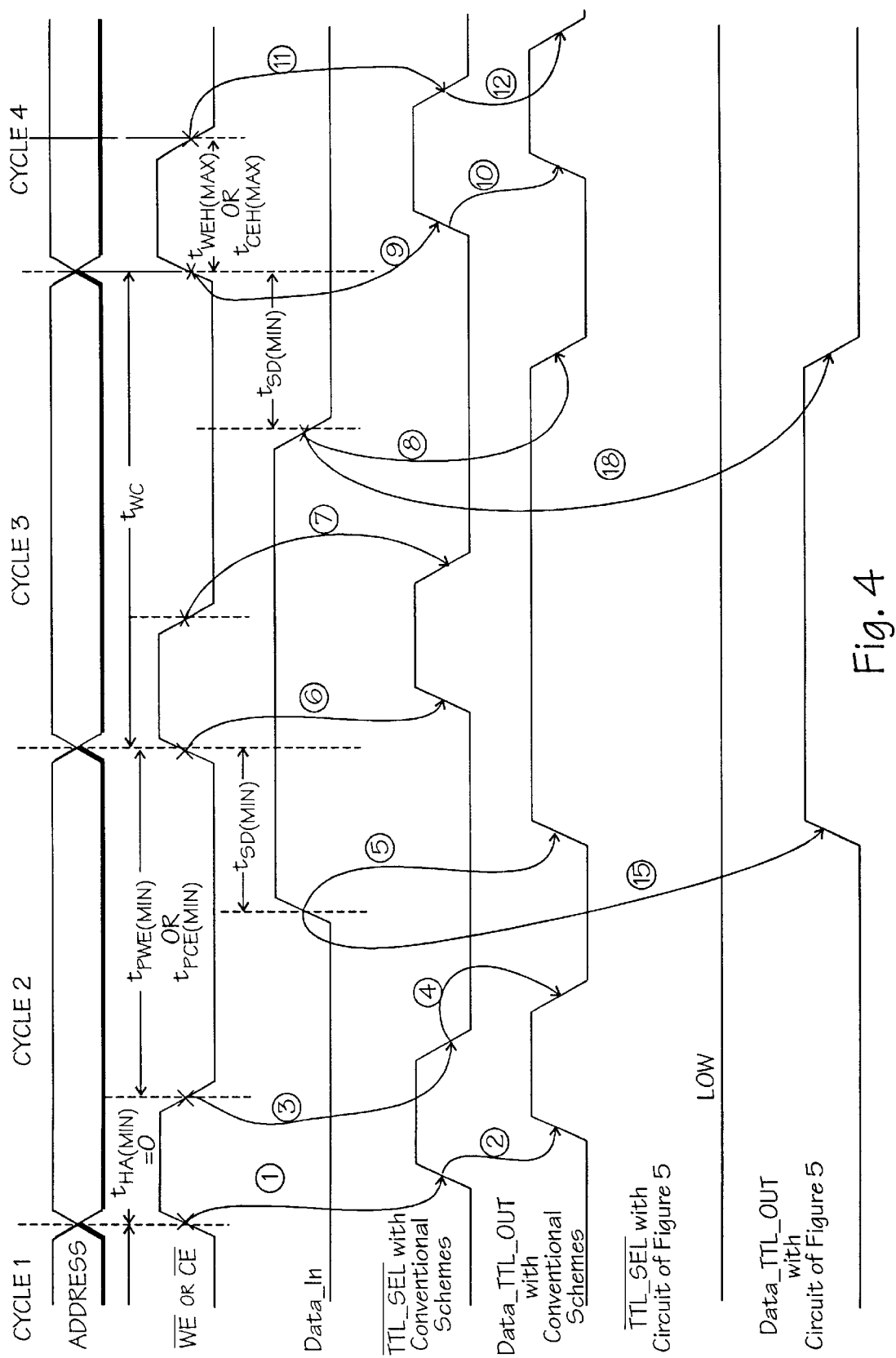
FIG. 4 illustrates various ICC switching waveforms for the conventional schemes of FIG. 3 and for schemes implemented according to the present invention.

Various continuous write cycle switching waveforms are shown in FIG. 4. The waveforms illustrated are for a Data (i.e., Data_IN) toggling case (i.e., a situation where a data "0" is written during a first cycle, followed by a data "1" during the second cycle and a data "0" during the third cycle) with a minimum data set-up time ($t_{SD(min)}$). The address toggles during each cycle with minimum address hold time $t_{HA}$. The write enable signal $\overline{WE}$ (or, in some cases the chip enable signal $\overline{CE}$) also toggles, with minimum write pulse width $t_{PWE}$ and maximum signal high time $t_{WEH}$ (or $t_{CEH}$). In FIG. 4, the "TTL_SEL" signal and the Data TTL output (i.e., "Data_TTL_out") waveforms are shown for the conventional schemes of FIG. 3 and also for the present invention.

Consider first the waveforms that are generated using the conventional schemes. For a data toggling, 2-continuous write cycles case, only the transitions labeled as 5 and 8 are necessary. The "un-necessary" switching transitions are labeled as 1, 2, 3, 4, 6 and 7. The switching transitions "1->2" and "3->4" cause "un-necessary" switching in the data input path of the circuitry 10 shown "circled" in FIG. 2. If only $\overline{WE}$ is toggling, the conventional schemes 2, 3 and 4 of FIG. 3 generate the un-necessary switching shown in FIG. 4. If only $\overline{CE}$ is toggling, the conventional schemes 1, 3 and 4 of FIG. 3 generate the un-necessary switching shown in FIG. 4. If both $\overline{CE}$ and $\overline{WE}$ are toggling, all of the conventional schemes described above generate the "un-necessary" switching shown in FIG. 4. Hence the conventional schemes described above have the drawback of consuming extra-current due to "un-necessary switching" in the data input circuitry (i.e., circuitry 10 in FIG. 2) of the data path of the memory device during a continuous write cycle operation. The extra current consumed is directly proportional to the width of the data bus and, in general, the $ICC_{WW}$ penalty for a multi-port memory is proportional to "m*databus_width*$I_{extra}$", where "$I_{extra}$" is the extra current in the "single bit" of the data input path switching circuitry of FIG. 2, and "m" is an integer representing number of memory ports.

Figure 5:
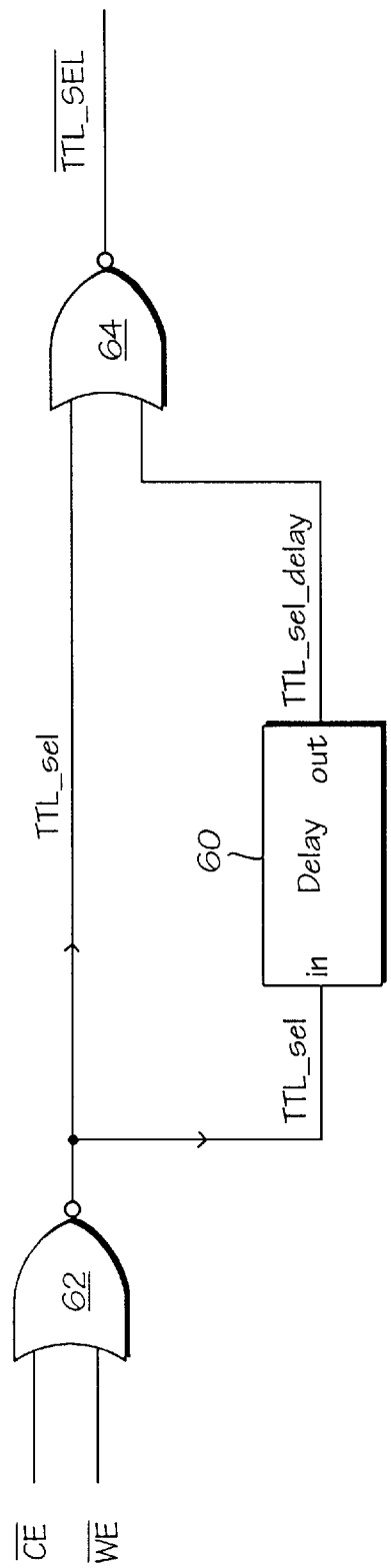
FIG. 5 illustrates one embodiment of a circuit for generating a write data select signal in accordance with the present invention.

One embodiment of a circuit for the generation of a Write Data select signal (i.e., TTL_SEL) according to the present invention is shown in FIG. 5. A unique "write power-down" delay ($t_{WPD}$) is designed as a function of "$\overline{CE} + \overline{WE}$" and incorporated into the generation of the Write Data select signal, TTL_SEL. Note that the delay $t_{WPD}$ is provided by a delay device 60 and that the delay so provided is preferential. That is, a delay is provided when the input signal TTL_sel transitions from a logic "1" to a logic "0", but no delay is produced when TTL_sel transitions from a logic "0" to a logic "1".

The Write Data select signal TTL_SEL is produced by providing signals $\overline{CE}$ and $\overline{WE}$ to the inputs of NOR gate 62. Nor gate 62 produces signal TTL_sel and provides this signal to the input of delay device 60 and a first input of NOR gate 64. Delay device 60 produces a delayed signal TTL_sel_delay (according to $t_{WPD}$) from TTL_sel, and provides signal TTL_sel_delay to a second input of NOR gate 64. NOR gate 64 generates Write Data select signal TTL_SEL from the two input signals.

The $t_{WPD}$ delay is designed to meet the following requirements as set forth in equations (2) and (3):

$$t_{WPD}+t_{MISC}<t_{PD} \tag{2}$$

$$t_{WPD}>MAX(t_{CEH}, t_{WEH}) \tag{3}$$

where $t_{PD}$ is the $\overline{CE}$ high to power-down parameter, $t_{MISC}$ is the miscellaneous delays in $\overline{CE}$ or $\overline{WE}$ path (the maximum of the two) from the $\overline{CE}$ or $\overline{WE}$ pad inputs to the TTL_SEL input of the Data TTL's shown in FIG. 2, excluding the $t_{WPD}$ delay. The maximum $\overline{CE}$ and $\overline{WE}$ signal high times during a continuous write cycle are $t_{CEH}$ and $t_{WEH}$ respectively.

Figure 6:
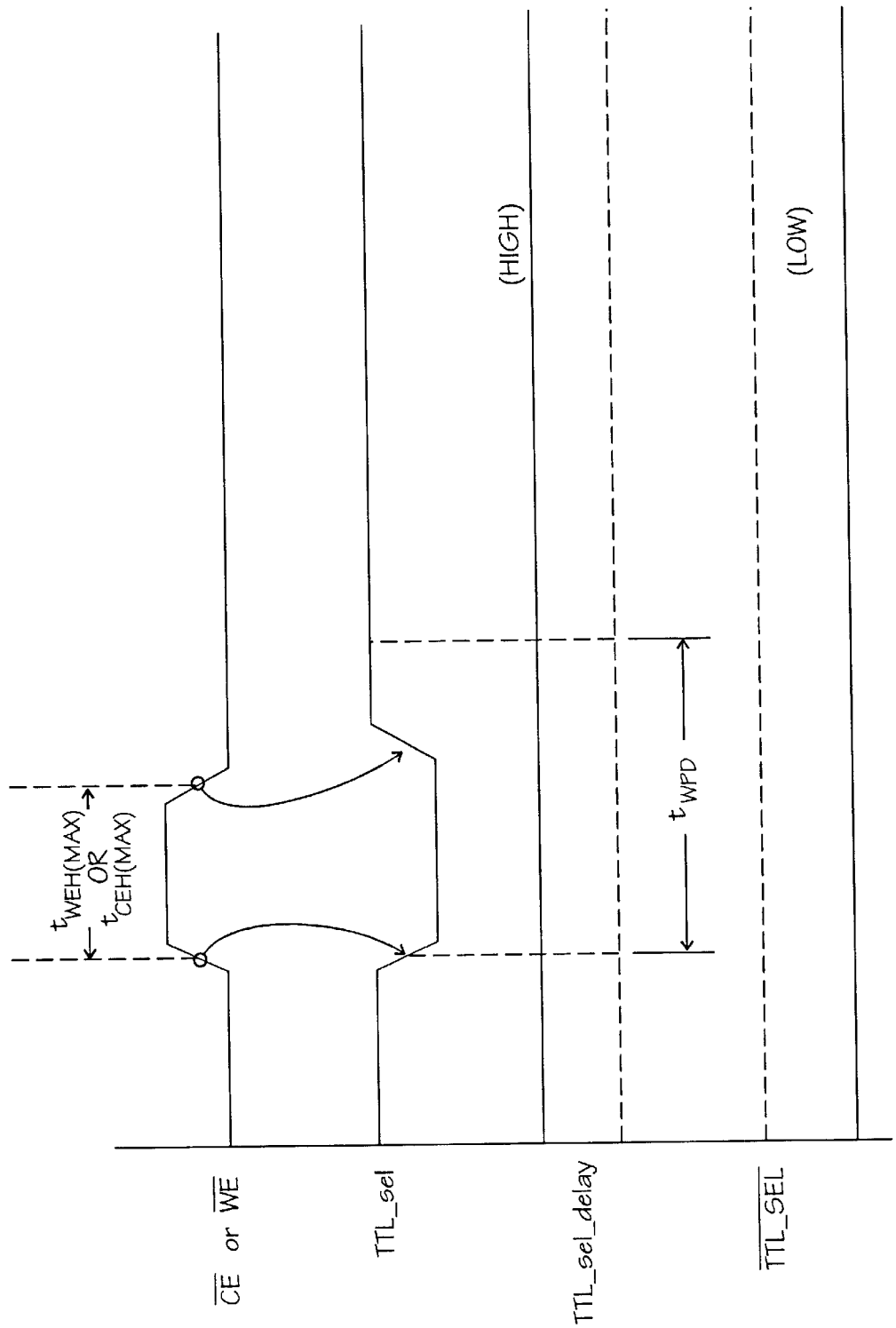
FIG. 6 illustrates various waveforms associated with signals shown in FIG. 5.

FIG. 6 shows how a $\overline{CE}$ or $\overline{WE}$ transition is filtered by the delay element 60 of the circuit illustrated in FIG. 5. Notice that although the signal TTL_sel follows the transition, TTL_SEL is unaffected because of the actions of delay element 60. Thus, in FIG. 4, TTL_SEL remains low despite the toggling of $\overline{CE}$ or $\overline{WE}$, thus eliminating the "unnecessary" switching of the conventional schemes of FIG. 3.

The present invention achieves several desirable results. For example, in a continuous write cycle, the maximum $t_{CEH}$ and $t_{WEH}$ pulses are filtered and the TTL_SEL signal is powered-up (active low) for the entire continuous write cycle. This eliminates the "un-necessary" transitions and "un-necessary" switching currents produced by the conventional schemes of FIG. 3. As shown in FIG. 4, in this new scheme only the necessary transitions "I5" and "I8" are generated for the data toggling case using the circuit of FIG. 5.

Further, the $t_{WPD}$ delay scheme of the present invention does not impact read and write parameters and the design can meet the $t_{PD}$ requirements of those memory components which provide such a limitation while still filtering the MAX($t_{CEH}$, $t_{WEH}$) pulse widths.

In addition, for an "m" port memory device, having an "n-bit" databus width, the continuous write cycle ICC savings using the present invention, are proportional to "m*n*$I_{extra}$", where $I_{extra}$ is the "extra" switching current in the data write input path of FIG. 2 using the conventional schemes of FIG. 3 for the generation of the TTL_SEL signal, where "m" and "n" are integers.

It should be noted that in a commercially available dual port memory device, the technique described herein saved approximately 75 mA of current for a worst-case scenario as compared to the conventional techniques described above, for a 15 nS continuous write cycle time.

Thus, a method and apparatus for reducing continuous write cycle current in a memory device have been described. Although discussed with reference to specific illustrated embodiments, it should be appreciated that the present invention is applicable to a variety of memory devices. Accordingly, the above described embodiments and accompanying diagrams should be regarded as illustrative only and the present invention should in no way be limited thereby.

What is claimed is:

1. A circuit, comprising:
   a write power-down delay device configured to receive a write data select signal and to provide a delayed write data select signal in response thereto when the write data select signal transitions from a first logic state to a second logic state, but not when the write data select signal transitions from said second logic state to said first logic state; and a logic circuit configured to receive the write data select signal and the delayed data write select signal and to produce a filtered write data select signal in response thereto.

2. A circuit as in claim 1 wherein the write power-down delay device is further configured to provide a selective delay such that the delayed write select signal is produced when the write data select signal transitions from a logic high to a logic low and further configured to provide no delay when the write data select signal transitions from a logic low to a logic high.

3. A circuit as in claim 1 wherein the write data select signal is a logical combination of a chip enable signal and a write enable signal.

4. A circuit as in claim 3 wherein the logical combination of the chip enable signal and the write enable signal is a logical NOR.

5. A circuit as in claim 4 wherein the logic circuit configured to receive the write data select signal and the delayed data write select signal provides a logical NOR function.

6. A circuit as in claim 5 wherein the write power down delay device is included in a data input path of a memory device.

7. A method of producing a write data select signal in a memory device, comprising the steps of:

receiving a write data select signal and generating a delayed write data select signal in response thereto when the write data select signal transitions from a first logic state to a second logic state, but not when the write select signal transitions from said second logic state to said first logic state; and receiving the write data select signal and the delayed write data select signal and generating a filtered write data select signal in response thereto.

8. The method of claim 7 wherein the filtered write data select signal activates a TTL-to-CMOS level converter in a data input path circuit of the memory device.

9. The method of claim 8 wherein the write data select signal is a logical combination of a chip select signal and a write enable signal provided to the memory device.

10. The method of claim 9 wherein the filtered write data select signal is a logical combination of the write data select signal and the delayed write data select signal.

11. The method of claim 10 wherein the logical combination of the write data select signal and the delayed write data select signal is a logical NOR.

12. The method of claim 11 wherein the delayed write data select signal is time delayed from the write data select signal only when the write data select signal transitions from a logic high to a logic low.

13. The method of claim 11 wherein the delayed write data select signal is time delayed from the write data select signal by at least a time equal to the greater of a chip enable logic high time during a write cycle of the memory device and a write enable logic high time during a write cycle of the memory device.

14. A memory device, comprising:

write data path circuitry configured to receive a data input signal and to provide a data write signal in response to a filtered write data select signal the write data path circuitry including a write power-down delay device configured to receive a write data select signal and to provide a delayed write data select signal in response thereto when the write data select signal transitions from a first logic state to a second logic state, but not when the write data select signal transitions from the second logic state to the first logic state; and driver circuitry coupled to receive the data write signal from the write data path circuitry.

15. A memory device as in claim 14 wherein the write data path circuitry further comprises a logic circuit configured to receive the write data select signal and the delayed data write select signal and to produce the filtered write data select signal in response thereto.

16. A memory device as in claim 15 wherein the write power-down delay device is further configured to provide a selective delay such that the delayed write data select signal is produced when the write data select signal transitions from a logic high to a logic low and further configured to provide no delay when the write data select signal transitions from a logic low to a logic high.

17. A memory device as in claim 15 wherein the write data select signal is a logical combination of a chip enable signal and a write enable signal provided to the memory device.

18. A memory device as in claim 17 wherein the logical combination of the chip enable signal and the write enable signal is a logical NOR.

19. A memory device as in claim 18 wherein the logic circuit configured to receive the write data select signal and the delayed data write select signal provides a logical NOR function.

20. A memory device as in claim 19 wherein the driver circuitry is further configured to receive a group write signal indicating a selected group of memory cells for the memory device to receive the data write signal.

* * * * *